US010326478B2

(12) United States Patent
Trifonov et al.

(10) Patent No.: US 10,326,478 B2
(45) Date of Patent: Jun. 18, 2019

(54) APPARATUS AND METHOD FOR ENCODING AND DECODING DATA IN TWISTED POLAR CODE

(71) Applicant: Samsung Electronics Co., Ltd, Gyeonggi-do (KR)

(72) Inventors: Peter Vladimirovich Trifonov, Saint-Petersburg (RU); Vera Dmitriyevna Miloslavskaya, Saint-Petersburg (RU)

(73) Assignee: Samsung Electronics Co., Ltd., Suwon-si (KR)

( * ) Notice: Subject to any disclaimer, the term of this patent is extended or adjusted under 35 U.S.C. 154(b) by 302 days.

(21) Appl. No.: 14/684,284

(22) Filed: Apr. 10, 2015

(65) Prior Publication Data

US 2015/0295593 A1    Oct. 15, 2015

(30) Foreign Application Priority Data

Apr. 10, 2014   (RU) ................................ 2014114215

(51) Int. Cl.
*H03M 13/00*   (2006.01)
*H03M 13/37*   (2006.01)
(Continued)

(52) U.S. Cl.
CPC ....... *H03M 13/3746* (2013.01); *H03M 13/13* (2013.01); *H03M 13/45* (2013.01); *H03M 13/611* (2013.01)

(58) Field of Classification Search
CPC ............... H03M 13/13; H03M 13/616; H03M 13/3746; H03M 13/15; H03M 13/152; H03M 13/27
(Continued)

(56) References Cited

U.S. PATENT DOCUMENTS 6,341,362 B1 *   1/2002   Golnabi ............ H03M 13/1515
714/784
7,346,832 B2     3/2008   Richardson et al.
(Continued)

FOREIGN PATENT DOCUMENTS

KR     20110060635 A    6/2011
KR     20120054571 A    5/2012
(Continued)

OTHER PUBLICATIONS

Erdal Arikan, Senior Member, IEEE, Channel Polarization: A Method for Constructing Capacity-Achieving Codes for Symmetric Binary-Input Memoryless Channels, Transactions on Information Theory, vol. 55, No. 7, Jul. 2009, 24 pgs.*

(Continued)

*Primary Examiner* — Shelly A Chase
*Assistant Examiner* — Osman M Alshack

(57) ABSTRACT

The disclosure relates to noiseless coding and, in particular, to the use of twisted polar code in data encoding and decoding. The disclosure increases the speed of encoding and/or decoding through the reduction in the number of iterations to be performed. The object is attained in method for encoding data, comprising the steps of: pre-coding, by a pre-coding module, data presented in the form of k-dimensional binary vector x, the pre-coding consists in computing $u^{(0)} = xW$, where W is a matrix of dimension $\kappa \times 2^m$, and m is a code parameter; performing, by the pre-coding module, m-layer twisted polarization transformation of vector $u^{(0)}$, wherein i-th transformation layer consists in partitioning vector $u^{(i-1)}$ into $2^{m-1}$ subvectors of length 2, multiplying the subvectors by matrix (Continued)

$$\begin{pmatrix} 1 & 0 \\ 1 & 1 \end{pmatrix},$$

merging the resulting subvectors into one vector of dimension $2^m$.

14 Claims, 16 Drawing Sheets

(51) Int. Cl.
*H03M 13/13* (2006.01)
*H03M 13/45* (2006.01)

(58) Field of Classification Search
USPC .................................. 714/752, 776, 782, 786
See application file for complete search history.

(56) References Cited

U.S. PATENT DOCUMENTS

| | | | | |
|---|---|---|---|---|
| 8,311,144 B1* | 11/2012 | Sun | .................... | H04L 25/03343 375/267 |
| 8,347,186 B1* | 1/2013 | Arikan | ................... | H03M 13/13 714/774 |
| 2005/0243895 A1* | 11/2005 | Ashikhmin | ............. | H04J 13/00 375/146 |
| 2006/0228116 A1* | 10/2006 | Bontu | ................ | H04B 10/2572 398/152 |
| 2008/0063115 A1* | 3/2008 | Varadarajan | ......... | H04B 7/0417 375/299 |
| 2010/0039928 A1* | 2/2010 | Noh | ..................... | H04B 7/0617 370/210 |
| 2013/0117344 A1 | 5/2013 | Gross et al. | | |
| 2013/0132803 A1* | 5/2013 | Xiao | ..................... | H03M 13/13 714/776 |
| 2014/0108748 A1* | 4/2014 | Lee | .................... | H03M 13/1111 711/154 |
| 2014/0341320 A1* | 11/2014 | Hua | ..................... | H04B 7/0417 375/299 |
| 2014/0365842 A1 | 12/2014 | Li et al. | | |
| 2015/0103947 A1* | 4/2015 | Shen | ........................ | H04B 1/04 375/295 |
| 2015/0194987 A1* | 7/2015 | Li | ......................... | H04L 1/0057 714/752 |
| 2015/0236715 A1* | 8/2015 | Alhussien | ............... | H03M 7/40 341/67 |
| 2015/0263767 A1* | 9/2015 | Shin | .................... | H03M 13/134 714/796 |
| 2015/0293716 A1* | 10/2015 | Jiang | .................... | H03M 13/13 711/154 |

FOREIGN PATENT DOCUMENTS

| | | |
|---|---|---|
| KR | 20130001494 A | 1/2013 |
| WO | WO 2013107140 A1 | 7/2013 |

OTHER PUBLICATIONS

Arikan, E.; "Channel Polarization: A Method for Constructing Capacity-Achieving Codes for Symmetric Binary-Input Memoryless Channels"; IEEE; vol. 55, Issue 7; Jul. 2009; 24 pgs.
Arikan, E.; "Systematic Polar Coding"; IEEE; vol. 15, Issue 8; Jun. 30, 2011; 4 pgs.
Li, et al.; "An Adaptive Successive Cancellation List Decoder for Polar Codes with Cyclic Redundancy Check"; IEEE; vol. 16, Issue 12; Nov. 19, 2012; 5 pgs.
Mahdavifar, et al.; "On the Construction and Decoding of Concatenated Polar Codes"; ISIT; Jul. 7-12, 2013; 6 pgs.
Niu, et al.; "CRC-Aided Decoding of Polar Codes"; IEEE; vol. 16, Issue 10; Sep. 7, 2012; 5 pgs.
Tal, et al.; "List Decoding of Polar Codes"; ISIT; IEEE; vol. PP, Issue 99; Mar. 5, 2015; 12 pgs.
Tal, et al.; "How to Construct Polar Codes"; IEEE; vol. 59, Issue 10; Jul. 10, 2013; 22 pgs.
Trifonov, P.; "Efficient Design and Decoding of Polar Codes"; IEEE: vol. 60, Issue 11; Aug. 22, 2012; 8 pgs.

* cited by examiner

APPARATUS AND METHOD FOR ENCODING AND DECODING DATA IN TWISTED POLAR CODE

CROSS-REFERENCE TO RELATED APPLICATION AND CLAIM OF PRIORITY

The present application is related to and claims the benefit under 35 U.S.C. § 119(a) of a Russian patent application filed on Apr. 10, 2014 in the Russian Intellectual Property Office and assigned Serial No. 2014114215, the entire disclosure of which is hereby incorporated by reference.

TECHNICAL FIELD

The present application relates generally to noiseless coding and, more specifically, to the use of twisted polar code in data encoding and decoding.

BACKGROUND

Polar codes proposed by E. Arikan "Channel polarization: A method for constructing capacity achieving codes for symmetric binary-input memoryless channels" (IEEE Transactions On Information Theory, Volume 55, No. 7, pages 3051-3073, July 2009 (REF 1)) represent a first class of correcting codes that achieve the bandwidth of a broad class of communications channels. Polar codes are linear block codes generated by a submatrix of matrix $A=B_m R^{\otimes m}=R^{\otimes m} B_m$ where $B_m$ is a bit-organized permutation matrix $$R = \begin{pmatrix} 1 & 0 \\ 1 & 1 \end{pmatrix},$$

and $\otimes m$ is m-fold Kronecker product of the matrix by itself. Thus, the code word of the polar code is $c=uA$, $c \in GF(2)^n$, $n=2^m$, where $u_i$, $i \in (0, 1, \ldots, n-1)/F$ are coded information symbols, and $u_i$, $i \in F$ are assumed to be 0 (frozen symbols, such as symbols whose values never change). Classic method of decoding y obtained by transmission of c over a memory-free channel, symmetric by output, is the successive cancellation method (SC). The method comprises successively finding the most probable a posteriori values $u_i$ using values $u_0, \ldots, u_{i-1}, y_0, \ldots, y_{n-1}$. The found value $u_i$ is used in the subsequent steps of the decoding algorithm. It can be shown that the combination of a linear transformation specified by matrix A, physical data channel and SC decoder (assuming that intermediate solutions are correct) are represented as a set of n bit subchannels of various quality, such as each $u_i$ is assumed to be transmitted over i-th subchannel. A quality (such as bandwidth, probability of error per bit) of these subchannels is analyzed using the probability density evolution method consisting in computing the density of distribution of log likelihood ratios computed at various stages of the SC method (I. Tal and A. Vardy "How to construct polar codes", IEEE Transactions On Information Theory, Volume 59, No. 10, October 2013 (REF 2)), or its Gaussian approximation (P. Trifonov "Efficient design and decoding of polar codes", IEEE Transactions on Communications, Volume 60, No. 11, pages 3221-3227, November 2012 (REF 3)). A possible method of constructing a polar code of length n and dimension k is to select F as a plurality of indices of the worst bit subchannels.

SUMMARY

Noiseless coding is widely used in current systems of communication and storage of information. It is a primary object to provide a new structure of error-correcting codes and respective methods of encoding and decoding data. The present codes represent a generalization of recently suggested polar codes. The present approach solves the problem of small minimum distance, because of which the error correction capability of existing polar codes is significantly worse than that of LDPC and turbo codes. As a result, the present codes provide a lower probability of error in the waterfall region and a lower level of error probability saturation than LDPC and turbo codes. The present decoding method relies on the successive cancellation stack algorithm and improves it through the use of directed search methods. It also takes into account the structure of inventive twisted polar codes. Use of this decoding method with twisted polar codes provides some reduction in the decoding complexity as compared to classical polar codes.

In a first example, a method of encoding data is provided. The method includes pre-coding, by a pre-coding module, data presented in the form of k-dimensional binary vector x. The coding includes in computing $u^{(0)}=xW$, where W is a matrix of dimension $\kappa \times 2^m$, and m is a code parameter. The method also includes performing, by a pre-coding module, m-layer twisted polarization transformation of vector $u^{(0)}$. The i-th transformation layer includes in partitioning vector $u^{(i-1)}$ into $2^{m-1}$ sub-vectors of length 2 and multiplying the subvectors by matrix $$\begin{pmatrix} 1 & 0 \\ 1 & 1 \end{pmatrix}.$$

The method further includes merging the resulting subvectors in one vector of dimension $2^m$ and permuting elements of the resulting vector to obtain vector $u^{(i)}$, so that vector $u^{(m)}$ is obtained on m-th layer. The permutations are selected from a common affinity group. The method includes obtaining, by a multiplexer of an encoding apparatus, data encoded with twisted polar code by multiplexing elements of vector $u^{(m)}$. Use of matrix Wallows representing some elements (symbols) of vector $u^{(0)}$, the number of which is equal to n−k, as linear functions of its other elements (symbols). Such symbols are referred to as dynamically frozen. Note that classical polar codes is a special case of this structure, in which all these linear functions are identically equal to 0 and respective symbols are referred to as (statically) frozen.

In further aspects of the invention, matrix W is selected so that the resulting codewords are codewords of base extended BCH (Bose-Chaudhuri-Hocquenghem) code. The permutations are specified for subvectors of vector $u^{(i)}$ including $2^i$ contiguous elements by indexing elements of the subvectors with binary vectors of length i and specifying basis of i-dimensional linear spaces for each of the vectors, so that the output index is obtained as the product of input index by the matrix corresponding to this basis.

In a second example, a method of decoding encoded data is provided. The encoded data is encoded, for example, according to the above method of encoding where decoded data is obtained in a decoding apparatus using a successive cancellation method. In the successive cancellation method probabilities of paths in a code tree are computed recursively on m layers, and probabilities on layer i−1 are computed from probabilities permuted on layer i, wherein the used permutation is the same as used in the above method of encoding, and the decoding apparatus selects paths with regard to values of dynamically frozen symbols.

In further aspects of disclosure, values of dynamically frozen symbol are obtained from equation $u^{(0)}V^T=0$, where $WV^T=0$. The matrix V has the form in which no more than one row starts in each column, and no more than one row ends in each column. Values of dynamically frozen symbols are found using symbolic expressions of intermediate data of the decoding apparatus. The decoding apparatus stores a plurality of paths corresponding to sequences $(u_0^{(0)}, \ldots, u_{\phi l-1}^{(0)})$, and iteratively selects one of them for expansion to obtain one or two paths $(u_0^{(0)}, \ldots, u_{\phi l-1}^{(0)}, u_{\phi l}^{(0)})$, $u_{\phi l}^{(0)} \in \{0, 1\}$, so that constraints of dynamic freezing of symbols are met, wherein the selected path corresponds to the highest value $P(u_o^{(0)}, \ldots, u_{\phi l-1}^{(0)}|y_0^{n-1}|\psi(\phi_l))$, where $\psi(\phi_l)$ is the heuristic function defined by expression $\psi(i)=\Pi_{j-1}^{n-1}(1-P_j)$, $P_j$ is the probability of error per bit in j-th bit subchannel specified by polarization transformation.

In a third embodiment an encoding apparatus is provided. The encoding apparatus includes a module configured to precode data presented in the form of k-dimensional binary vector x, adapted to compute $u^{(0)}=xW$, where W is a matrix of dimension $\kappa \times 2^m$ and m is a code parameter. The module is configured to perform "exclusive or" logic function. The module is also configured to transmit data without change. The data is joined to m layers to enable m-layer twisted polarization transformation of vector $u^{(0)}$ and obtain vector $u^{(m)}$, wherein i-th transformation layer consists in partitioning vector $u^{(i-1)}$ into $2^{m-1}$ subvectors of length 2, multiplying the subvectors by matrix $$\begin{pmatrix} 1 & 0 \\ 1 & 1 \end{pmatrix},$$

merging the resulting subvectors in one vector of dimension $2^m$ and permuting elements of the resulting vector to obtain vector $u^{(i)}$, wherein the permutations are selected from a common affinity group. The apparatus also includes a multiplexer configured to produce a codeword encoded with twisted code from vector $u^{(m)}$ obtained on m-th transformation layer from vector $u^{(0)}$.

In a fourth example a decoding apparatus is provided. The decoding apparatus includes a first module configured to compute probabilities adapted to compute probabilities of intermediate symbols on m layers. The probabilities on (i-1)-th layer are obtained from permuted probabilities on layer i, the used permutation being the same that in the above encoding method. The first module is also configured to transmit the computed probability to second module for sequential processing. The apparatus also includes a second module configured to iteratively build paths in a code tree by retrieving a path with maximum metric from a stack. The second module is also configured to expand the path. The second module is further configured to store obtained paths in the stack. The second module is configured to determine values of decoded symbols. The decoding apparatus further includes a stack configured to store path identifiers and metrics. The stack is connected communicatively to the second module. The decoding apparatus includes a third module configured to update values of intermediate symbols. The third module is also configured to recursively compute values of intermediate symbols on m layers. The third module is configured to transmit the computed values of intermediate symbols to a memory device. The decoding apparatus also includes a memory device configured to store values of intermediate symbols $u^{(i)}$ and transmit the values of intermediate symbols to the module for sequential processing and the first module to compute probabilities.

The present invention offers a code structure and respective methods and apparatus for encoding and decoding, which provide higher correction capability and lower decoding complexity compared to classical polar codes and their improvements discussed above. Numerical results show that twisted polar codes provide a coding gain of up to 0.5 dB as compared with turbo and LDPC codes, and a better error correction capability compared with untwisted and classic polar codes with external CRC. Twisted polar codes also allow reducing the level of error probability saturation (the phenomenon observed with turbo codes and untwisted polar codes). Furthermore, the present decoding method uses heuristic function, which enables the number of iterations performed by the stack decoding algorithm to be significantly reduced.

The present invention increases the speed of encoding and/or decoding through the reduction in the number of iterations to be performed.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 19, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged electronic device.

Figure 1:
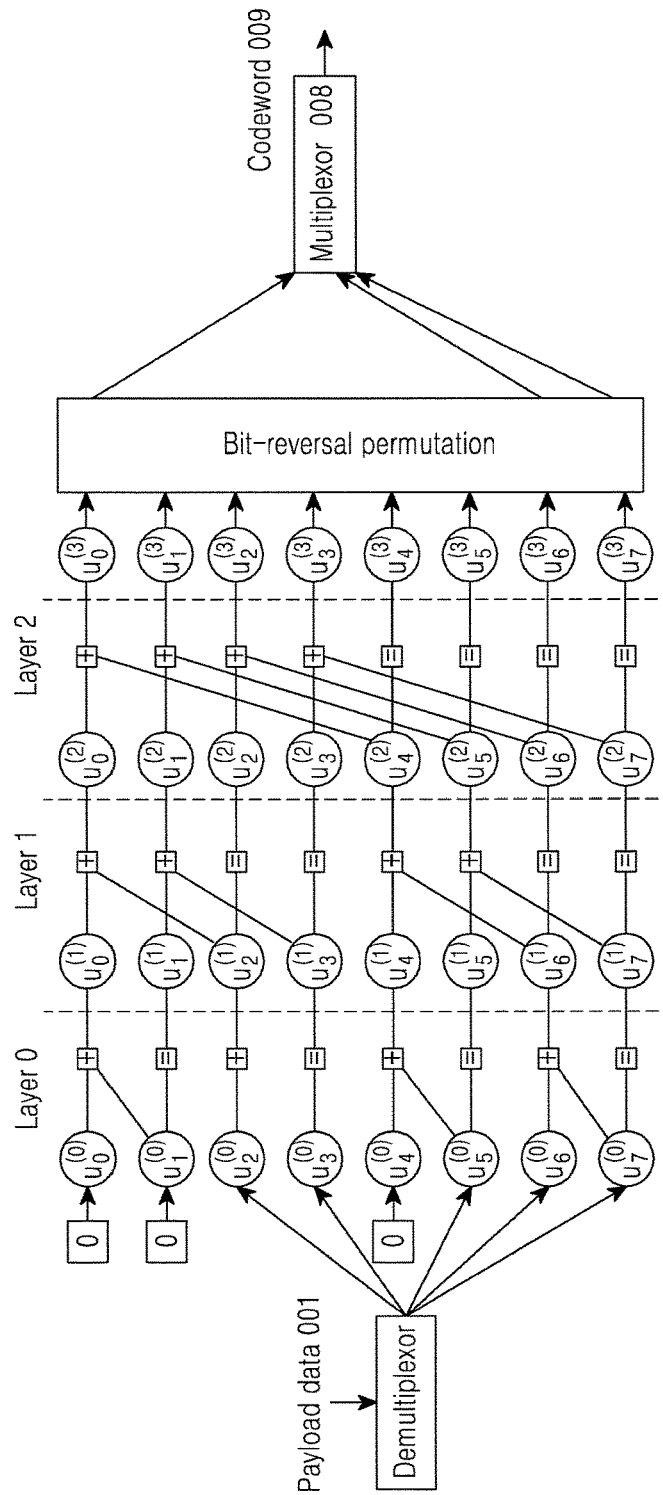
FIG. 1 illustrates an example structure of a polar code encoder according to this disclosure.

Polar codes proposed by E. Arikan "Channel polarization: A method for constructing capacity achieving codes for symmetric binary-input memoryless channels" (IEEE Transactions On Information Theory, Volume 55, No. 7, pages 3051-3073, July 2009 (REF 1)) represent a first class of correcting codes that achieve the bandwidth of a broad class of communications channels. Polar codes are linear block codes generated by a submatrix of matrix $A=B_m R^{\otimes m}=R^{\otimes m}B_m$ where $B_m$ is a bit-organized permutation matrix $$R = \begin{pmatrix} 1 & 0 \\ 1 & 1 \end{pmatrix},$$

and ⊗m is m-fold Kronecker product of the matrix by itself. Thus, the code word of the polar code is $c=uA$, $c \in GF(2)^n$, $n=2^m$ where $u_i$, $i \in (0, 1, \ldots, n-1) \backslash F$ are coded information symbols, and $u_i$, $i \in F$ are assumed to be 0 (frozen symbols, such as symbols whose values never change). Classic method of decoding y obtained by transmission of c over a memory-free channel, symmetric by output, is the successive cancellation method (SC). The method comprises successively finding the most probable a posteriori values $u_i$ using values $u_0, \ldots, u_{i-1}, y_0, \ldots, y_{n-1}$. The found value $u_i$ is used in the subsequent steps of the decoding algorithm. It can be shown that the combination of a linear transformation specified by matrix A, physical data channel and SC decoder (assuming that intermediate solutions are correct) are represented as a set of n bit subchannels of various quality, such as each $u_i$ is assumed to be transmitted over i-th subchannel. A quality (such as bandwidth, probability of error per bit) of these subchannels is analyzed using the probability density evolution method consisting in computing the density of distribution of log likelihood ratios computed at various stages of the SC method (I. Tal and A. Vardy "How to construct polar codes", IEEE Transactions On Information Theory, Volume 59, No. 10, October 2013 (REF 2)), or its Gaussian approximation (P. Trifonov "Efficient design and decoding of polar codes", IEEE Transactions on Communications, Volume 60, No. 11, pages 3221-3227, November 2012 (REF 3)). A possible method of constructing a polar code of length n and dimension k is to select F as a plurality of indices of the worst bit subchannels. FIG. 1 illustrates an example structure of a polar code encoder according to this disclosure. Encoding operation is partitioned into m layers. On layer i intermediate vector $u^{(i+1)}$ is obtained by applying a transformation specified by matrix R to subvectors $u^{(i)}$. Symbols on layer 0 are initialized by useful data symbols (for unfrozen symbols) or zeros (frozen symbols). Codeword is obtained on the last layer.

Figure 2:
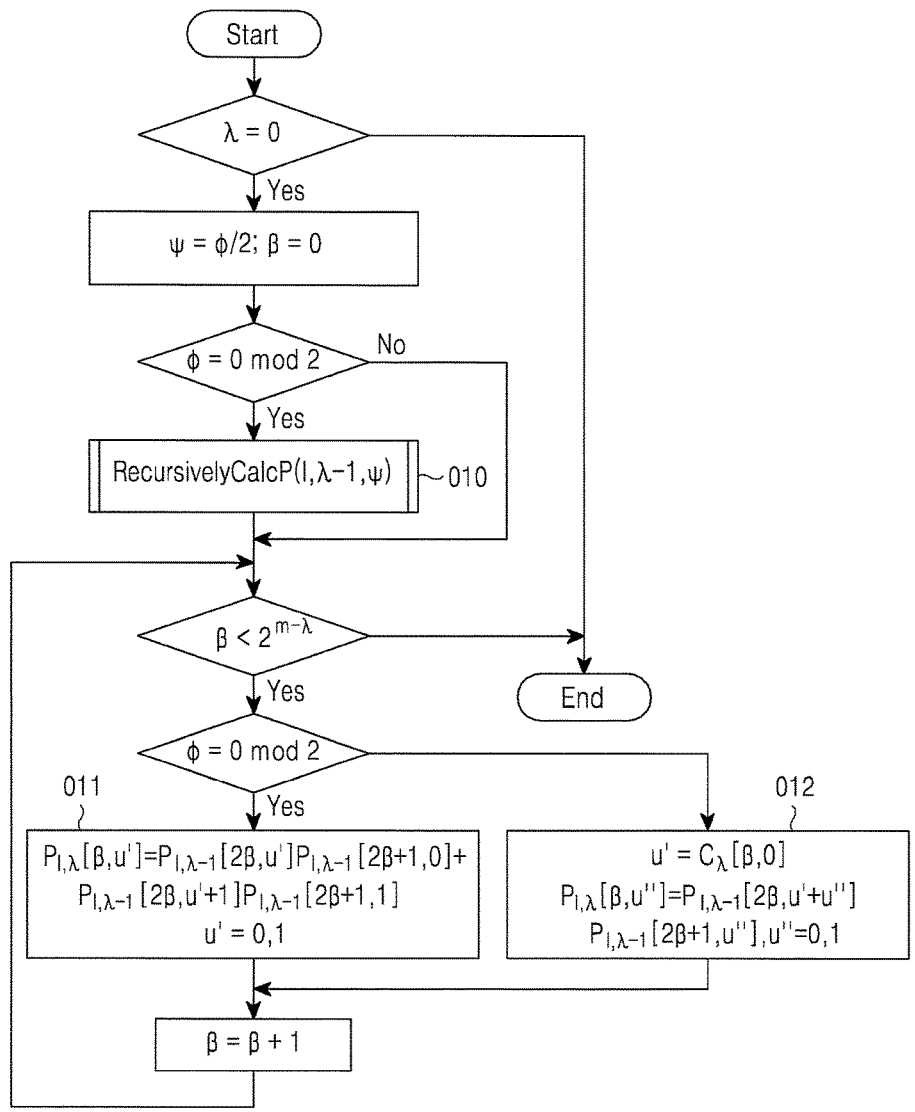
FIG. 2 illustrates an example recursive computation of RecursivelyCalcP (l, λ, φ) probabilities according to this disclosure.
Figure 3:
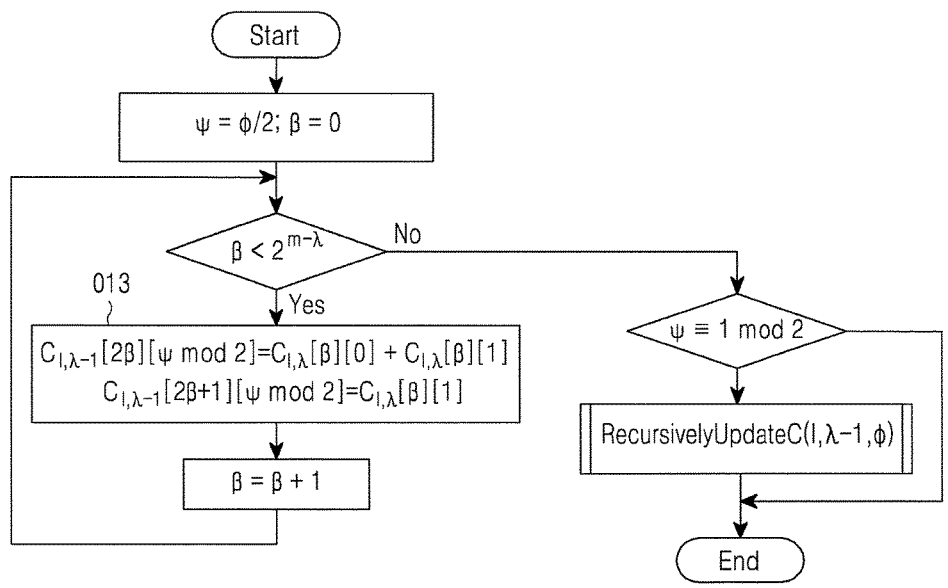
FIG. 3 illustrates an example recursive computation of intermediate symbols RecursivelyUpdateC (l, λ, φ) according to this disclosure.

The polar code is represented as a tree whose leaves are its codewords, and paths from the root to the leaves are defined by possible values of symbols $u_0, \ldots, u_{n-1}$. Optimal decoder find the most probable path in the tree, corresponding to received vector $(y_0, \ldots, y_{n-1})$. The above approach is used to construct codes reaching the channel bandwidth at $n \to \infty$. However, the error correction capability of polar codes of average length when they are decoded by the SC method is quite low. I. Tal and A. Vardy "List decoding of polar codes", IEEE International Symposium on Information Theory, 2011 (REF 4) has shown this problem is solved by list SC decoding. That is, instead of making a single decision on $u_i$, at each step of the SC decoder two paths can be analyzed, which correspond to different values of unfrozen symbol $u_i$. As a result, the number of paths $(u_0, \ldots, u_i)$ monitored by the decoder is doubled at each step $i \notin F$. To prevent the exponential growth of complexity and memory consumption it is suggested (as shown in REF 4) to retain no more than L most probable paths at every step. Probability of path $P_n^{(i)}(u_0^i | y_0^{n-1})$ is computed according to $$P_N^{(2i)}(u_0^{2i} | y_0^{N-1}) = \sum_{u_{2i+1}=0}^{1} P_{\frac{N}{2}}^{(i)}\left(u_{0,e}^{2i+1} + u_{0,o}^{2i+1} \middle| y_0^{\frac{N}{2}-1}\right) P_{\frac{N}{2}}^{(i)}(u_{0,o}^{2i+1} | y_{\frac{N}{2}}^{N-1}) \quad (1)$$

$$P_N^{(2i+1)}(u_0^{2i+1} | y_0^{N-1}) = P_{\frac{N}{2}}^{(i)}\left(u_{0,e}^{2i+1} + u_{0,o}^{2i+1} \middle| y_0^{\frac{N}{2}-1}\right) P_{\frac{N}{2}}^{(i)}(u_{0,o}^{2i+1} | y_{\frac{N}{2}}^{N-1}) \quad (2)$$

where $\alpha_i^j=(\alpha_i, \alpha_{i-1}, \ldots, \alpha_j)$, $\alpha_{i,e}^j$ and $\alpha_{i,o}^j$ are subvectors $\alpha_i^j$ with even and odd numbered components, respectively, and $P_1^{(0)}(\alpha|y)$ is the probability that symbol $\alpha \in GF(2)$ was transmitted with the proviso that the channel outputs symbol y (see REF 4). FIG. 2 is a flowchart of an example recursive function RecursivelyCalcP (l, λ, φ), which computes the probabilities for l-th path $u_0^\phi$ for the case of $N=2^\lambda$ according to this disclosure. See REF 4 for an example recursive function. Note that for even φ the function produces a recursive call to find values that appear on the right side of the above equations. Direct computations are performed in blocks that implement equations (1) and (2). Results are stored in variables $P_{l,\lambda}[\beta, b] = P_{2^\lambda}^{(\phi)}(u_0^\phi | y_{\phi 2^\lambda}^{(\phi+1)2^\lambda - 1})$, where $u_\phi = b$. Furthermore, the successive cancellation decoder stores values of intermediate symbols corresponding to each path. FIG. 3 is a flowchart of an example recursive function RecursivelyCalcC(l, $\lambda$, $\varphi$), which solves this task in accordance with REF 4. For l-th path $u_0^\phi$ the flowchart finds values of $C_{l,\beta}[\beta, \phi \mod 2] = u_{\phi + 2\lambda\beta}^{(m-\lambda)}$, which are used in computations of equations (1) and (2) according to this disclosure. The computations are performed in a block which corresponds to the encoder structure shown in FIG. 1.

The described approach significantly improves the error correction capability of polar codes in the low SNR domain. However, classical polar codes exhibit the effect of error probability saturation of a sufficiently high level, since their minimum Hamming distance is min $i \notin F$ wt($A_i$), where $A_i$ is i-th row of matrix A, and wt(x) is the Hamming weight of vector x. Data is encoded with CRC error detection code before it is encoded with polar code (see REF 4). Then among L paths in the code tree, found by the above algorithm, paths that have correct CRC checksum are chosen. It was shown experimentally that this approach provides a fairly good error correction capability, although no nontrivial estimates of the minimum distance have been found.

Figure 4:
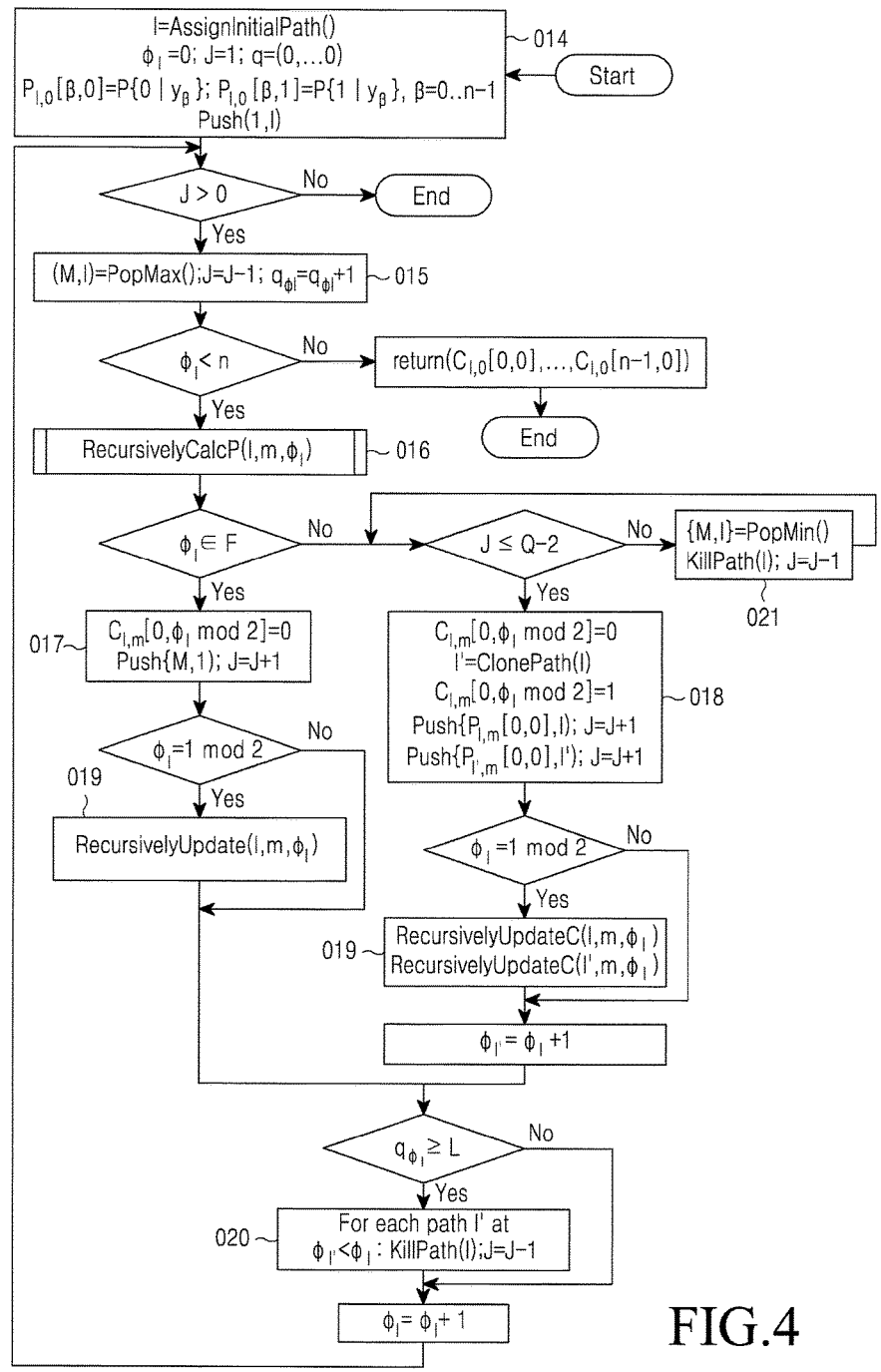
FIG. 4 illustrates an example stack decoding algorithm according to this disclosure.

To reduce the complexity of decoding, K. Niu and K. Chen "CRC-aided decoding of polar codes", IEEE Communications Letters, Volume 16, No. 10, October 2012 (REF (5), suggests that at every step of the SC decoder the most probable path, such as the path with the highest $P\{u_0, \ldots, u_{i-1}|y\}$, is to be chosen for further disclosure. The decoder maintains a stack (such as a priority queue) that contains paths of different lengths, so to effectively select the most probable of them. This approach (stack SC decoding) ensures 2-3-fold reduction in complexity compared to the list SC decoding without any loss in the error correction capability. FIG. 4 illustrates a flowchart of an example algorithm to implement this approach according to this disclosure. The algorithm uses data structures and support functions. (as shown in REF 4). It uses a stack (such as a priority queue) supporting operation Push(s, l), which stores in the stack integer l together with its metric s, PoPMax( ) and PopMin( ), which retrieves elements with the highest and lowest metrics, respectively, from the stack. Then an initial path is created, which is identified by integer 1. The probabilities of codeword symbols are computed for this path using channel transition probabilities function P(a|y) $=P_l^{(0)}(\alpha|y)$. Then, the path is placed in the stack. At each iteration of the algorithm the most probable path l, corresponding to a sequence of symbols $u_0, \ldots, u_{\phi l - 1}$, where $\phi_l$ is the path phase, is taken out from the stack together with its metric M. Then probabilities $P_{l,m}[0, 0] = P(u_0, \ldots, u_{\phi l-1}, u_{\phi l} = 0 | y_0^{n-1})$ and $P_{l,m}[0, 1] = P(u_0, \ldots, u_{\phi l-1}, u_{\phi l} = 1 | y_0^{n-1})$ are computed using function RecursivelyCalcP(l,m, $\varphi_l$). When symbol $u_{\phi l}$ is frozen, its value is assumed to be 0, and identifier l is placed in the stack with the previous value of metric M. Otherwise, the path is cloned (such as respective intermediate data is selectively replicated, as described in REF 4), in a new path identified by number l'. Initial path corresponds to $u_{\phi l} = C_{l,m}[0, \phi_l \mod 2] = 0$, while the cloned one corresponds to $u_{\phi l} = C_{l',m}[0, \phi_l \mod 2] = 1$. These paths are placed in the stack together with respective probabilities. Before this operation, it is checked whether the number of paths in stack J exceeds its maximum capacity Q after the cloning operation. If so, the least likely paths are removed from the stack. In both cases, if $\phi_1 \equiv 1 \mod 2$, values of intermediate symbols for paths placed in the stack are updated using RecursivelyUpdateC function. Furthermore, if number $q_{\phi l}$ of return of the decoder to $\phi_l$ phase exceeds a threshold L, all paths shorter than $\phi_l$ are removed in order to prevent the decoder from going around short irregular paths. The main disadvantage of this approach is that the decoder has to compare probabilities $P(u_0, \ldots, u_{\phi l-1}, u_{\phi l}|y)$ of paths of different lengths. It can be seen that $P(u_0, \ldots, u_{\phi l-1}, u_{\phi l}|y) \leq P(u_0, \ldots, u_{\phi l-1}, u_{\phi l-1}|y)$. Thus, the probability of a correct long path appears to be less than the probabilities of wrong short paths. As a result, the decoder switches between correct and wrong paths, thereby making a great amount of useless computations.

Another implementation of this approach in case of polar codes with external CRC is presented by B. Li, H. Shen, D. Tse "An Adaptive Successive Cancellation List Decoder for Polar Codes with Cyclic Redundancy Check", IEEE Communications Letters, 16 (12), December 2012 [6], and B. Li, H. Shen "Decoding method and decoding apparatus for polar code concatenated with cyclic redundancy check, patent application" (WO2013107140) (REF 7). The implementation comprises application of the Tala-Vardi algorithm of list decoding with a certain size of list L, searching among the found codewords for words with correct CRC and, in the absence thereof, re-starting the list decoder with double size of the list. These steps are repeated until a code word with correct CRC is found or the size of the list exceeds a predetermined value. The main disadvantage of this approach is its high computational complexity that is proportional to the maximum size of the list.

The problem of decoding polar codes is also analyzed by W. Gross, G. Sarkis, A. Raymond, S. Leroux, I. Tal, A. Vardy "Methods and Systems for Decoding Polar Codes" (US20130117344) (REF 8), where some methods are suggested to reduce the complexity of a non-list SC decoder. However the methods do not increase the error correction capability. Data encoding methods according to this disclosure provide a much smaller probability of decoding error per codeword as compared to REF 8.

The present disclosure provides an apparatus and methods to provide a regular structure of encoder 010 and decoder, like many modern designs of LDPC codes, for example, RU2395902, T. Richardson, X. Jin, "Methods and Apparatus for LDPC-encoding" (REF 9). However, the error correction capability of the present code structure is much better.

Basic idea of the present approach, which is reflected in respective methods for encoding and decoding, relies on the introduction of permutation of intermediate symbols appearing in the polarization transformation before forwarding them to the next layer of polarization transformation. This allows dynamic freezing of symbols, providing a sufficiently large minimum distance of the code, where all quite bad bit subchannels are frozen. Constrains of dynamic freezing are obtained using a parent extended BCH (Bose-Chaudhuri-Hocquenghem) code, and permutations are selected from a common affinity group, which is a group of automorphisms of Reed-Muller sub-codes for this code (F. J. MacWilliams and N. J. A. Sloane "The Theory of Error-Correcting Codes", 1977 (REF 10)). More specifically, elements of sub-blocks of intermediate vectors of polarization transformation are indexed with binary vectors which are equivalently considered as integers. For each layer and each sub-block, $C_{i,j,0}, \ldots, C_{i,j,i-1}$ basis of corresponding 1-dimensional linear subspace is indicated, so that output index x is computed from input $s = s_0 + 2s_1 + \ldots + 2^{i-2}s_{i-2}$, $S_j \in \{0, 1\}$ as $x = s_0 C_{i,j,1} \oplus s_1 C_{i,j,2} \ldots \oplus s_{i-2} C_{i,j,2}$. This defines permutation of vector elements. For example, matrix $$\begin{pmatrix} 0 & 1 & 0 \\ 1 & 1 & 0 \\ 0 & 0 & 1 \end{pmatrix}$$

corresponds to permutation 0→0, 2→3, 4→4, 6→7, 1→2, 3→1, 5→6, 7→. Formally, the present method of encoding for a code of length $n=2^m$ comprises the following steps:

At a first step, binary vector $u^{(0)}$ are constructed so that the dynamic freezing constraints, specified by a matrix V, are observed, such as $u^{(0)}V^T=0$.

At a second step, let i=1.

At a third step, let $u_{2^ij+x}^{(i)}=u_{2^ij+s}^{(i-1)} \oplus u_{2^ij+2^{i-1}+s}^{(i-1)}$, $u_{2^ij+(x\oplus C_{i,j,0})}^{(i)}=u_{2^ij+2^{i-1}+s}^{(i-1)}$, $0 \le j < 2^{m-1}$, $0 \le s < 2^{i-1}$, where $\oplus$ is bitwise "exclusive or" operation; $x=s_0C_{i,j,0} \oplus s_1C_{i,j,2} \oplus \ldots \oplus s_{i-2}C_{i,j,i-1}, s=s_0+2s_1+ \ldots +2^{i-2}s_{i-2}, s_j \in \{0, 1\}$ and $C_{i,j,0} \ldots C_{i,j,i-1}$) is a plurality of linearly independent binary vectors of length i, which is equivalently considered as integers.

At a fourth step, let i=i+1. If i≤m, and return to the third step.

It is seen that the encoder 010 structure described in the third step is similar to the structure used in the encoder of classical Arikan polar codes. Note that the latter are obtained by selecting $C_{i,j,l}$ equal to l-th unit vector and using only statically frozen symbols. This allows the use of SC decoder and its modifications taking into account inventive modifications. In particular, the effective embodiment of a list SC decoder described in the fourth step or its stack version, illustrate in FIG. 4, is used. As the present structure uses dynamically frozen symbols, in decoding the need arises to restore their values at steps i∈F, using values $u_j^{(0)}$, j<i. However, the embodiment suggested in the fourth step does not store these values. Thus, a method is suggested to recover them from intermediate variables of the algorithm taught in the fourth step.

Let A' is n×n matrix corresponding to the transformation defined by the third and fourth steps of the above algorithm. To provide a sufficiently large minimum distance of the resulting code an additional constraint is applied, which consist in the fact that codewords $u^{(0)}A'$ obtained in the aforementioned manner belong to another code (herein it is assumed that this code is an extended BCH code) with test matrix H, such as $u^{(0)}A'H^T=0$. Then matrix V, used in the first step of the encoding algorithm, is obtained as $V^T=A'H^TQ$, where Q is an invertible matrix. It is suggested to select matrix Q so that the complexity of recovery of intermediate symbols in processing of dynamic freezing constraints is minimal.

To reduce complexity of the stack decoding algorithm it is suggested to use values $P_{l,m}[0, \alpha]\psi(\phi_i+1)$ instead of $P_{l,m}[0, \alpha]\alpha \in \{0, 1\}$ as path metrics, where ψ(i) is the heuristic function, which defines the average probability of correct decisions after phase i. This allows the decoder to avoid frequent switching between short and long paths, thereby reducing the total number of iterations.

Figure 5:
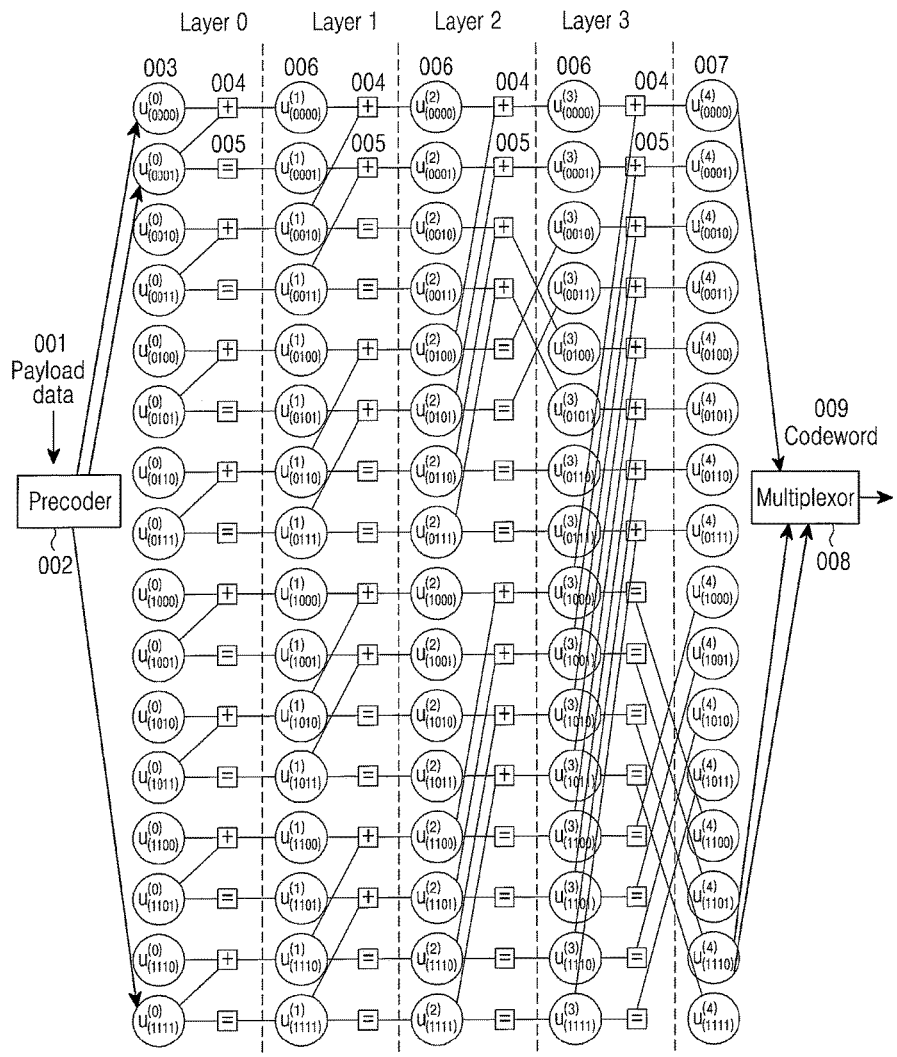
FIG. 5 illustrates an example twisted polar code encoder according to this disclosure.

FIG. 5 illustrates an example encoding method for m=4 according to this disclosure. Encoded data 001, represented as binary vector x of length k, is input to precoder 002, which computes $u^0=xW$ so that $u^{(0)} \in GF(2)^n$, $n=2^m$, $u^{(0)}V^T=0$, where W and V are binary matrices satisfying $WV^T=0$. Resulting initial vector 003, denoted by $u^{(0)}$, is subjected to twisted polarization transformation. It is constructed by recursively applying the transformation specified by $$u'' = u'\begin{pmatrix} 1 & 0 \\ 1 & 1 \end{pmatrix}.$$

This transformation is realized by "exclusive or" unit 004, which computes the modulo-2 sum of input values, and pass-through unit 005, which outputs the input value without change. This yields vector $u^{(1)}$, which is further processed in a similar manner. The module configured to perform "exclusive or" function and the pass-through module (configured to transmit data unchanged) are arranged in m layers. On layer i intermediate vector $u^{(i+1)}$ is represented as $2^{m-i-1}$ subvectors of length $2^{i+1}$. Prior to transmitting the intermediate vector to the next layer, its components are permuted, and components of different subvectors are permuted in different manner. Vector $c=u^{(4)}$ thus obtained is denoted by final vector 007. Its elements are multiplexed using a multiplexor 008 into codeword 009 of twisted polar code. This codeword is further transmitted over a communications channel or stored by a recording device. Note that the rearrangement on the last layer is not obligatory. This rearrangement is shown here only to illustrate a specific permutation structure described below.

It should be understood that the twisted polar code is a linear block code. The above encoding method corresponds to computing:

$$c=xG \qquad (3)$$

where G=WA' is a code generator k×n matrix, and A' specifies twisted polarization transformation. However, the same code is obtained by replacing G in equation (3) by G'=QG, where Q is an invertible k×k matrix. In particular, in some applications it is advisable to use systematic encoding, such as select G'=(I|S)P, where I is a unity matrix, S is a k×(n−k) matrix and P is a permutation matrix. In this case, the resulting codeword contains useful data vector x as a subvector. Although the structure of systematic (or any other) encoder differs from that described above for example as illustrate in FIG. 5, it still generates the same code. In particular, the method described in 11 is used to construct an effective systematic encoder 010 for twisted polar codes. Furthermore, standard techniques of shortening and puncturing codes are used to obtain codes of different length from the above twisted polar code.

Matrix V is used to provide a sufficiently large minimum distance $d \ge d_0$ of the resulting code. It is constructed as follows. Let H is a test matrix of a base code of length n with minimum distance $d_0$. Let A' is an n×n matrix corresponding to twisted polarization transformation. Vector $u^{(0)}$ should be constructed so that the respective codeword c of the twisted polar code is also a codeword of the base code, such as $u^{(0)}A'H^T=0$. Thus, $V=Q^THA'^T$ is obtained, where Q is an arbitrary invertible matrix. To increase the error correction capability, matrix V is obtained and is supplemented with rows of weight 1. Particular added rows are defined with account of the error probability in bit subchannels defined by the polarization transformation A'. $l'_i=\min(j|V_{ij}=1)$ and $l''_i=\max(j|V_{ij}=1)$ are made to be the initial and final position of row i, respectively. With elementary operations performed on the rows of matrix $HA^T$, V is obtained such that no more than one row begins and no more than one row ends at position i, $0 \le i < n$. The latter property means that $$u_i^{(0)}=\Sigma_{j<i:V_{ij}=1}u_j^{(0)}, i \in F \qquad (4)$$

where t is the index of the row ending at position i, $F=\{i|\exists j:l_j''=i\}$, and modulo-2 sum is computed. The first property generally reduces the number of terms in REF 4 and simplifies computing the expression. Symbols $u_i^{(0)}$, $i \in F$ are referred to as frozen. Frozen symbols for which $l'_i = l''_i$ (such as $u_i^{(0)} = 0$) are referred to as statically frozen symbols, while those for which $l'_i \neq l''_i$ are referred to as dynamically frozen symbols.

Preferably, extended BCH code is used as the base code in the described structure. With this, the number of positions i, for which REF 4 comprises a non-trivial sum, is small, which simplifies decoding. Furthermore, this allows the use of a specific structure of permutations, which is compactly specified. The permutations are determined by indexing elements of sub-vectors of length $2^i$ of vectors $u^{(i)}$ with binary vectors of length i and specifying different basis of corresponding i-dimensional linear spaces. For each layer i and each subvector $u_{2^i j}^{(i)}, u_{2^i j+1}^{(i)}, \ldots, u_{2^i (j+1)-1}^{(i)})$ of length $2^i$ of vector $u^{(i)}$ $C^{i,j,0}, \ldots, C^{i,j,i-1}$ basis is specified (which is represented as i×i matrix with rows $C_{i,j,l}$) of corresponding i-dimensional linear subspace, so that output index x within j-th block is obtained from input index $s = s_0 + 2s_1 + \ldots + 2^{i-2} s_{j-2}, s_j \in \{0,1\}$ as $x = s_0 C_{i,j,2} \oplus \ldots \oplus s_{i-2} C_{i,j,\ldots i-1}$. This defines a permutation of elements of the vector. More specifically, the encoder 010 is implemented as follows:

At a first step it is assumed that $u_i^{(0)}$, $i \notin F$ are equal to elements of payload vector x, and compute remaining elements $u_i^{(0)}$ according to (2). Note that this is equivalent to computing $u^{(0)} = xW$ for corresponding matrix W.

At a second step, let i=1.

At a third step, $u_{2^i j+x}^{(i)} = u_{2^i j+s}^{(i-1)} \oplus u_{2^i j+2^{i-1}+s}^{(i-1)}$, $u_{2^i j+(x \oplus C_{i,j,0})}^{(i)} = u_{2^i j+2^{i-1}+s}^{(i-1)}$, $0 \leq j < 2^{m-i}$, $0 \leq s < 2^{i-1}$ is computed, where $\oplus$ is bitwise "exclusive or" operation; $x = s_0 C_{i,j,0} \oplus s_1 C_{i,j,2} \oplus \ldots \oplus s_{i-2} C_{i,j,i-1}. s = s_0 + 2s_1 + \ldots + 2^{i-2} s_{i-2}$, $s_j \in \{0, 1\}$ and $C_{i,j,0} \ldots C_{i,j,i-1}$) is a set of linearly independent vectors of length i, which is equivalently represented as integers.

At a fourth step i=i+1. If i≤m, then go to the third step.

At a fifth step a codeword is obtained as $u^{(m)}$.

It should be appreciated that there are other equivalent encoding methods, which generate the same plurality of codewords. All these methods are obtained by replacing matrix W with W'=QW in the above algorithm, where Q is a reversible k×k matrix.

For example, FIG. 5 corresponds to the following basis vectors that define permutations:

$C_{1,j,0} = (1)$, $0 \leq j < 8$,
$C_{2,j,0} = (1,0)_2 = 2$, $C_{2,j,1} = (0,1)_2 = 1$, $0 \leq j < 4$,
$C_{3,0,0} = (0,1,0)_2 = 2$, $C_{3,0,1} = (0,0,1)_2 = 1$, $C_{3,0,2} = (1,0,0)_2 = 4$,
$C_{3,1,0} = (1,0,0)_2 = 4$, $C_{3,1,1} = (0,0,1)_2 = 1$, $C_{3,1,2} = (0,1,0)_2 = 2$,
$C_{4,0,0} = (1,1,0,0)_2 = 12$, $C_{4,0,1} = (0,0,0,1)_2 = 1$, $C_{4,0,2} = (0,0,1,0)_2 = 2$,
$C_{4,0,3} = (0,1,0,0)_2 = 4$.

It is seen that there are two distinctions over the classical polar encoder as illustrated in FIG. 1: availability of precoder 002, and the edges connecting successive layers are permuted.

Note that it is sufficient to only indicate $C_{i,j,0}$, and specify a deterministic algorithm for finding linearly independent vectors $C_{i,j,s}$, $1 \leq s \leq i-1$. Thus, each permutation is specified by i bits only, which is significantly less than $\log_2 2^i!$ bits for an arbitrary permutation.

The specific form of permutations used should be determined such that to minimize the probability of errors in resulting bit subchannels. This is accomplished, for example, by complete enumeration (or one or more randomized searches) of all possible permutations defined by non-degenerate m×m binary matrices and computation of the error probability in corresponding unfrozen bit subchannels using density evolution.

Figure 6:
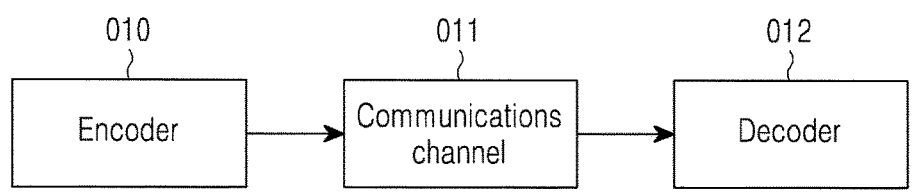
FIG. 6 illustrates an example digital communications system according to this disclosure.
Figure 7:
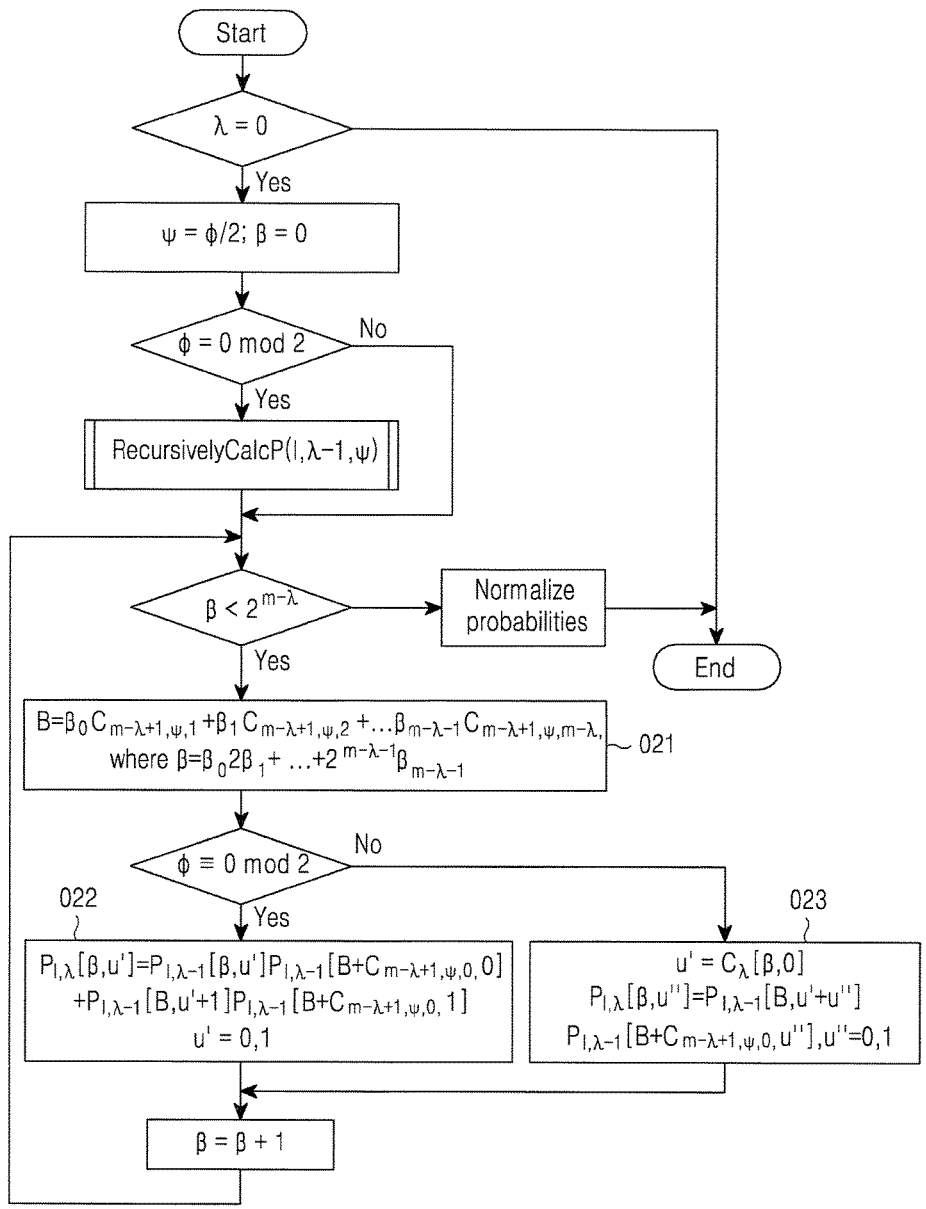
FIG. 7 illustrates an example recursive computation of probabilities for twisted polar code RecursivelyCalcP (l, λ, φ) according to this disclosure.
Figure 8:
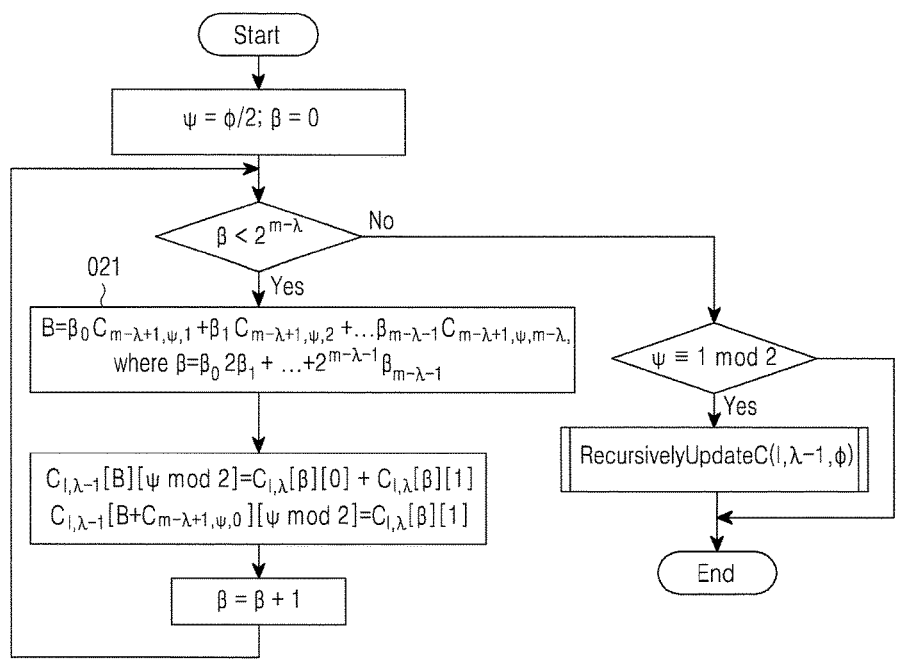
FIG. 8 illustrates an example recursive computation of values of intermediate symbols for twisted polar code RecursivelyUpdateC (l, λ, φ) according to this disclosure.

The present encoder is used in data transmission or data storage systems. FIG. 6 illustrates an example of a data transmission or data storage system according to this disclosure. Respective decoders must take into account the specific structure of permutations and constraints (see REF 2) in order to find the most probable codeword corresponding to the received noisy vector. Successive cancellation decoder and its list option 4 or stack option 5 must compute probabilities of paths similarly to how it is done in the case of classical polar codes. FIG. 7 illustrates a flowchart of an example modified RecursivelyCalcP function for computing these probabilities according to this disclosure. The example function illustrated in FIG. 7 uses the same approach as in 4, which takes into account the above described permutation structure. It is seen that it coincides with the function in FIG. 2, except for new block 021, which computes input indexes in accordance with the above permutation method, while blocks 011 and 012 are replaced by blocks 022 and 023 using the index computed in block 021. Furthermore, the SC decoder takes into account values of intermediate symbols 006 corresponding to each path. This is realized by appropriately modified RecursivelyCalcC algorithm as shown in FIG. 8. It also contains index computation unit 021, and performs the same steps as in block 013.

The SC decoder, its list option 4 and stack option 5 should take a decision on each symbol $u_i^{(0)}$. In the case of dynamic frozen symbols these decisions are made based on the values of symbols found at the previous algorithm steps. However, the embodiment described in 4 does not store these values explicitly. In this regard, it is suggested to recover them from the intermediate values stored in array C filled by RecursivelyCalcC function as shown in FIG. 8. This is accomplished as follows: Let $u_j^{(0)}$, j<i, is one of members the right side terms of REF 2. To recover it at phase i of path l, $u_j^{(0)} = E(m - [\log_2(i-j)], m, 0, j)$ is computed, where:

$$E(\lambda_0, \lambda, \beta, \phi) = $$

$$E\left(\lambda_0, \lambda-1, C_{m-\lambda_0+1, \frac{\phi}{2}, 0} + \sum_i \beta_i C_{m-\lambda_0+1, \frac{\phi}{2}, i+1}, \left\lfloor \frac{\phi}{2} \right\rfloor \right), \quad \lambda_0 < \lambda \wedge \phi \equiv 1 \bmod 2$$

$$E\left( \begin{array}{l} \lambda_0, \lambda-1, C_{m-\lambda_0+1, \frac{\phi}{2}, 0} + \\ \sum_i \beta_i C_{m-\lambda_0+1, \frac{\phi}{2}, i+1} \end{array}, \left\lfloor \frac{\phi}{2} \right\rfloor \right) + $$

$$E\left(\lambda_0, \lambda-1, \sum_i \beta_i C_{m-\lambda_0+1, \frac{\phi}{2}, i+1}, \left\lfloor \frac{\phi}{2} \right\rfloor \right), \quad \lambda_0 < \lambda \wedge \phi \equiv 0 \bmod 2$$

$$C_{l, \lambda}[\beta, \phi \bmod 2], \quad \lambda_0 = \lambda,$$

and $\beta = \sum_i B_i 2^i$. This expression is constructed in the symbolic form when designing the decoder, so that REF 4 is expressed in terms $C_{l, \lambda}[\beta, \tau]$. It is seen that the number of terms in the obtained expression for $u_j^{(0)}$, such as its computation complexity, increases with i−j. This fact justifies the need for matrix V, such that no more than one row starts and ends at every position, since in this case i−j is usually minimized.

Furthermore, the following method is suggested to reduce the complexity of stack decoding, which is used both with twisted and conventional polar codes. Note that the MAP decoder must find a vector $u^{(0)}$ such that the value:

$$P(u_0^{(0)}, \ldots, u_{n-1}^{(0)} | y_0^{n-1}) = P(u_0^{(0)}, \ldots, u_{\phi-1}^{(0)} | y_0^{n-1}) \prod_{j=\phi}^{n-1} P(u_j^{(0)} | u_0^{(0)}, \ldots, u_{j-1}^{(0)}, y_0^{n-1}) \quad (5)$$

is maximum. The original stack algorithm operates locally on the code tree, choosing at each step a path which maximizes the first term in expression (3), as the remaining terms are unknown. Assuming that $u_0^{(0)}, \ldots, u_{j-1}^{(0)}$ are correct values of information symbols, find that each of the remaining terms is the probability of correct finding of $u_j^{(0)}$ by the SC decoder [1] for given vector $y_0^{n-1}$. Values average for $y_0^{n-1}$ of these probabilities is easily computed using the density evolution method or its approximations at the second and third steps. Then, instead of maximizing $P(u_0^{(0)}, \ldots, u_{\varphi-1}^{(0)}|y_0^{n-1})$ at each step of the stack algorithm $$E[P(u_0^{(0)}, \ldots, u_{n-1}^{(0)}|y_0^{n-1})] = P(u_0^{(0)}, \ldots, u_{\varphi-1}^{(0)}|y_0^{n-1}) \Pi_{j=\varphi}^{n-1} E[P(u_j^{(0)}|u_0^{(0)}, \ldots, u_{j-1}^{(0)}, y_0^{n-1})] \qquad (6)$$

is maximized.

Figure 9:
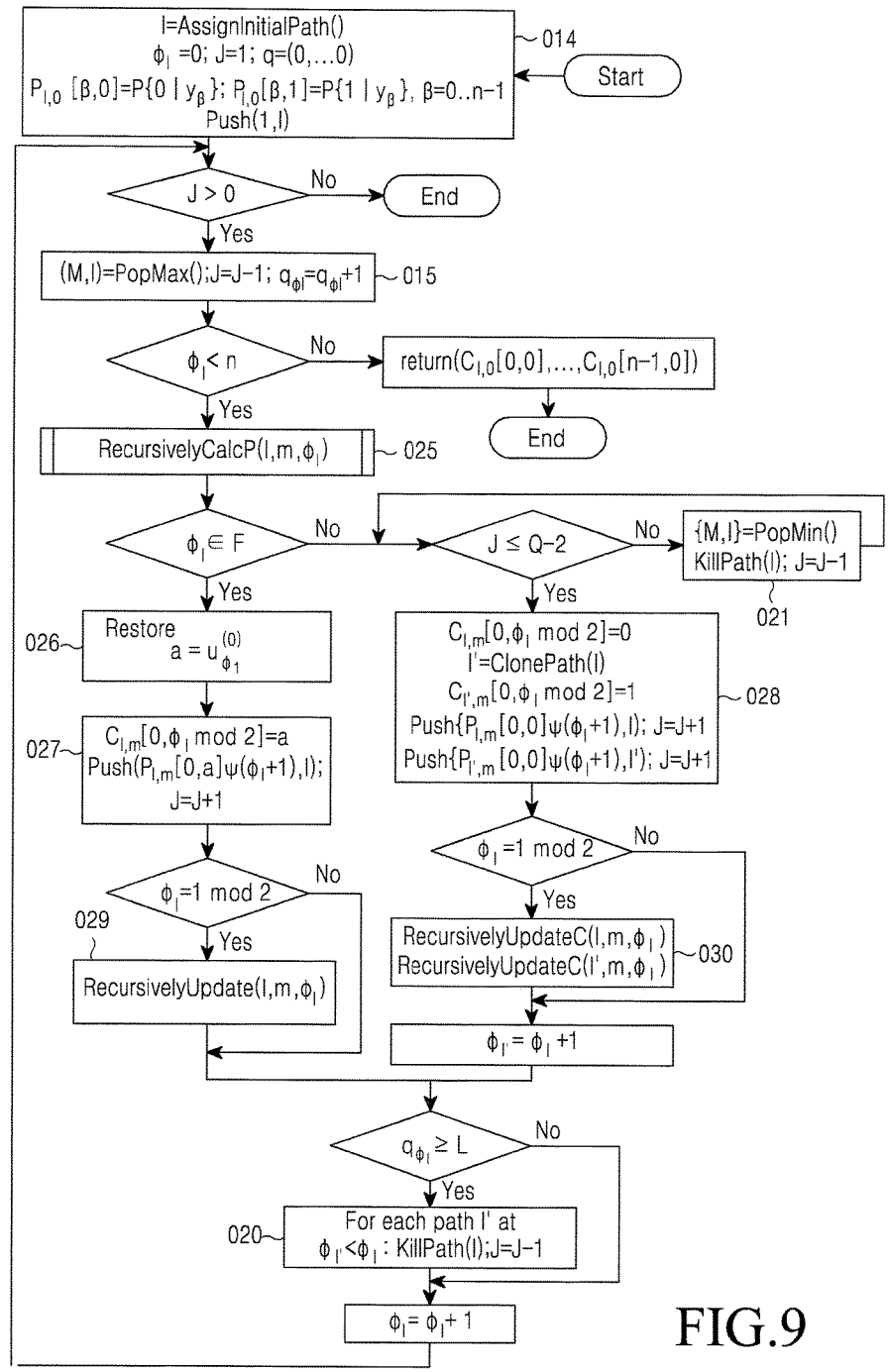
FIG. 9 illustrates an example improved stack decoding method with directed search according to this disclosure.

By introducing heuristic function $\psi(i) = \Pi_{j=i}^{n-1}(1-P_j)$, where $P_j = 1 - E[P(u_j^{(0)}, \ldots, u_{j-1}^{(0)}, yn-1)]_0$ is the error probability in j-th bit subchannel specified by polarization transformation, an improved stack decoding algorithm is obtained as illustrated in FIG. 9. Its distinctions over the original option as illustrated in FIG. 4 are:

$P_{l,m}[0, \alpha]\psi(\varphi_l+1)$ is used instead of $P_{l,m}[0, \alpha]$ as a path metric in blocks 027 and 028.

Computation of dynamically frozen symbols $u_{\varphi i}^{(0)}$ is performed in block 026 in accordance with (2) and the fast algorithm for $\varphi_l \in F$ described above, which is necessary in decoding twisted polar codes with dynamically frozen symbols. However, the present method is also used for polar codes with only statically frozen symbols.

Modified algorithms RecursivelyCalcP and RecursivelyCalcC (7, 8) should be used to account for the structure of twisted polarization transformation in blocks 025, 029, 030. Initial versions thereof as illustrated in FIGS. 2 and 3 are special cases of modified versions.

It should be understood that those skilled in the art implement the present method in many ways. In particular, instead of path probabilities their logarithms are used. Probabilities are computed approximately. Computations of some of them, corresponding to frozen symbols, are omitted. Furthermore, more accurate heuristic functions $\psi(i)$ are used. For example, such functions take into account the initial part of the path in the code tree to estimate the probability of remaining symbols. In general, increasing the accuracy of estimating the probability of remaining symbols, defined by function $\psi(i)$, enables the number of iterations in the decoder to be reduced.

The methods of encoding and decoding described above is implemented in hardware (such as in ASIC) or software, which allows constructing encoding and decoding apparatus. The present encoding apparatus includes a precoder that performs a computation $u^{(0)} = xW$. The encoding apparatus also includes an "exclusive or" unit and pass-through unit as illustrated in FIG. 5. The encoding apparatus further includes connecting edges performing a permutation.

Figure 10:
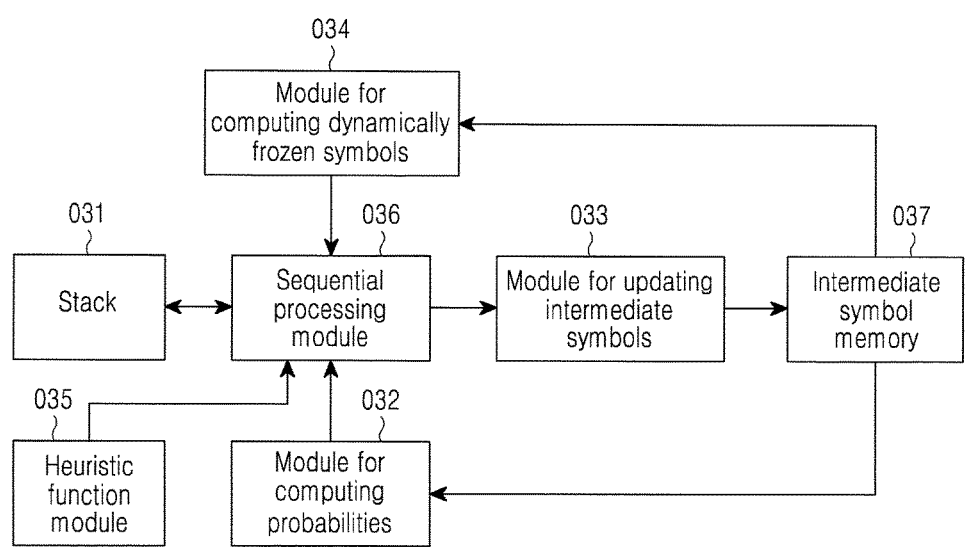
FIG. 10 illustrate an example decoding apparatus according to this disclosure.

As illustrated in FIG. 10, a decoding apparatus includes a stack 031 which stores identifiers of paths l together with their metrics M, and supports retrieval of records with the highest and lowest M, as well as remove of an arbitrary record. The decoding apparatus also includes a first module 032 is configured to compute probabilities as illustrated in FIG. 7. The decoding apparatus further includes a second apparatus 033 configured to update intermediate symbols as illustrated in FIG. 8. The decoding apparatus includes a memory device 037 configured to store values $u_j^{(0)}$. The decoding apparatus includes a third module 036 for sequential processing, which performs computations as illustrated in FIG. 9. The decoding apparatus includes a fourth module 035, which stores or computes values of heuristic function $\psi(i)$. The decoding apparatus includes a fifth module 034 configured to compute dynamically frozen symbols, which computes $u_j^{(0)} = E(m = [\log_2(i-j)], m, 0, j)$.

Note that modules 035 and 034 are not obligatory. Modules 032, 033, 037 are used to implement a list decoder of twisted polar codes.

Figure 11:
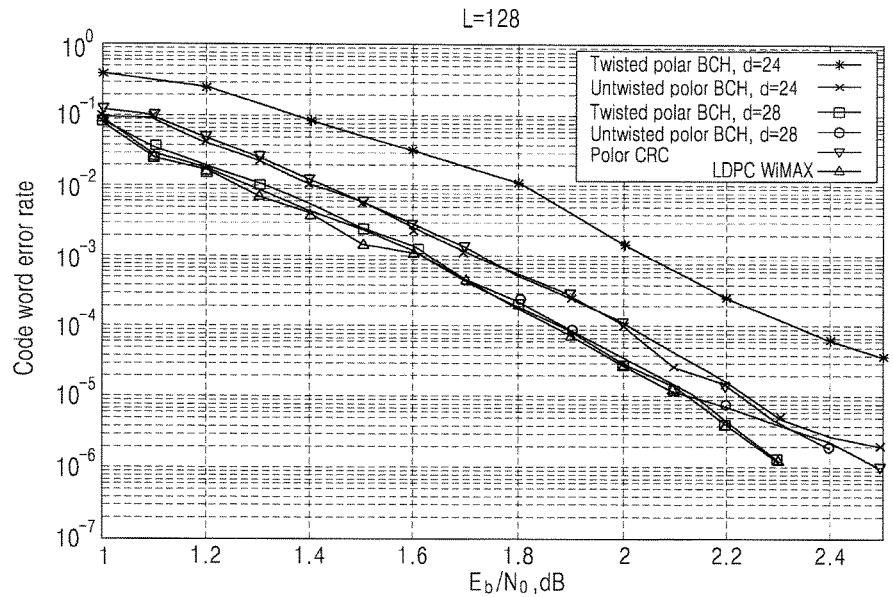
FIG. 11 an example error correction capability of codes with a rate of ½ according to this disclosure.
Figure 12:
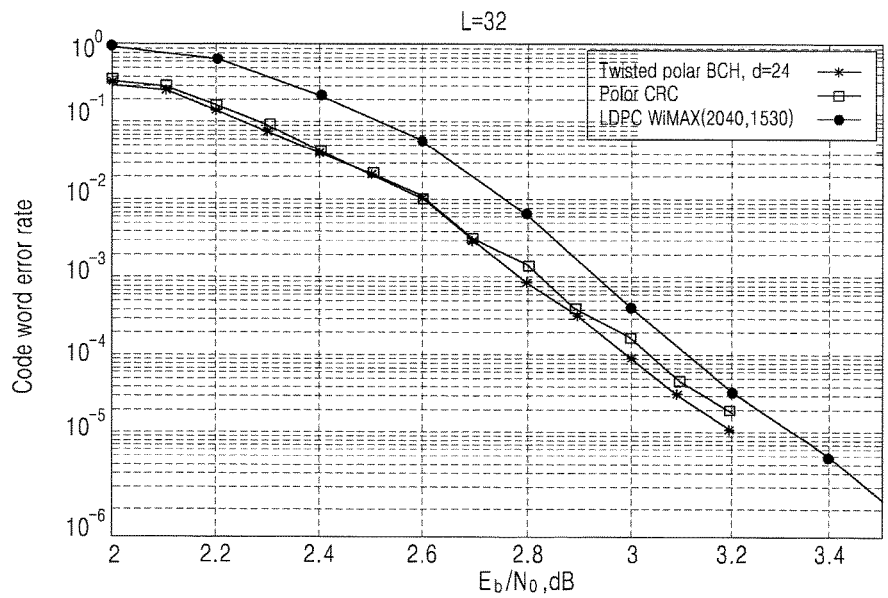
FIG. 12 an example error correction capability of codes with a rate of ¾ according to this disclosure.
Figure 13:
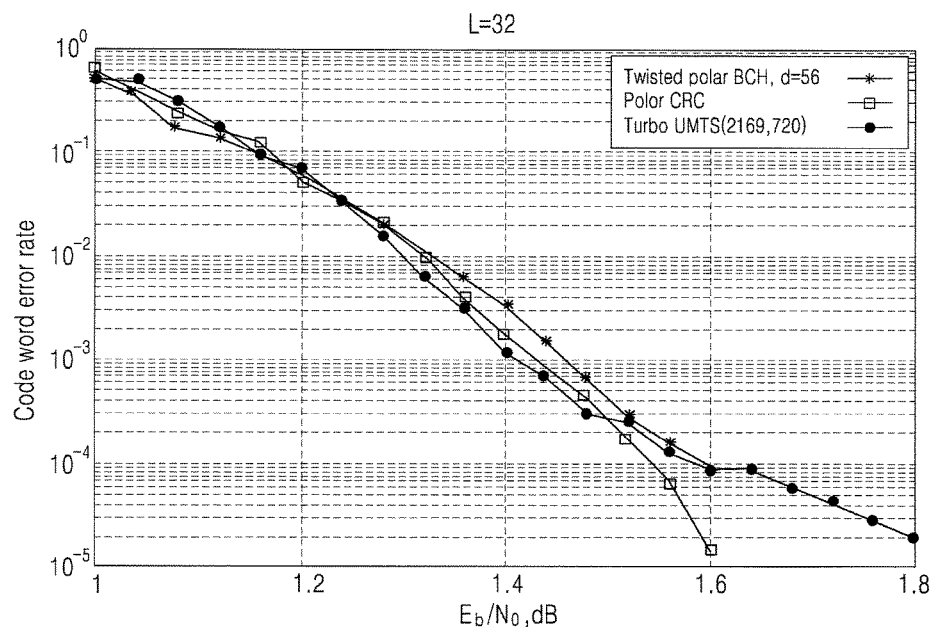
FIG. 13 illustrate an example error correction capability of codes with a rate of ⅓ according to this disclosure.
Figure 16:
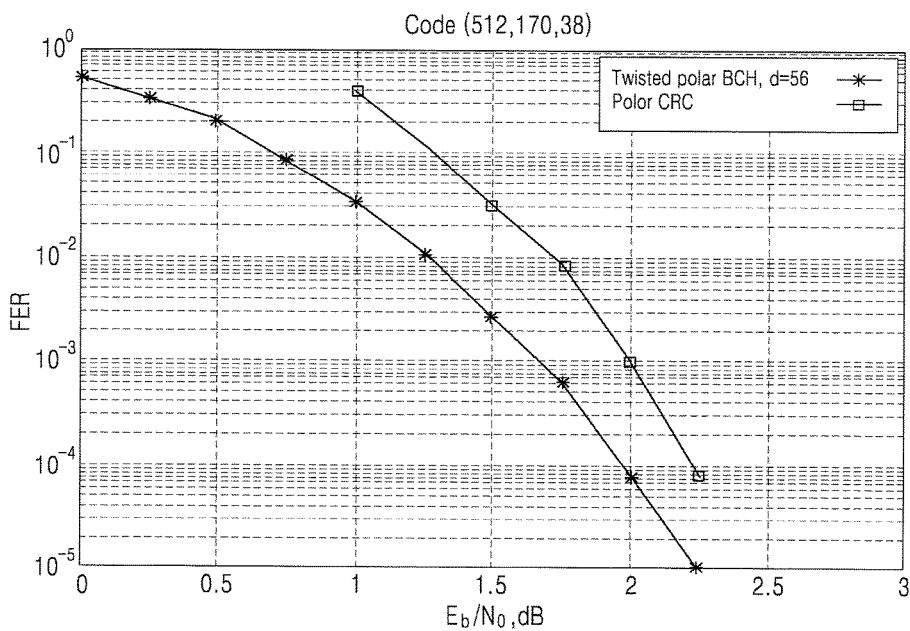
FIG. 16 illustrates an example comparison of twisted polar and concatenated codes with external Reed-Solomon and inner polar codes according to this disclosure.

The present methods of encoding and decoding are used in wireless and wireline communication systems, magnetic and optical data storage systems. FIGS. 11, 12 and 13 illustrate error correction capability examples of twisted and untwisted polar codes based on extended BCH codes as compared to polar codes with external CRC 4, LDPC and turbo codes of varying length and rate. It is noticed that twisted polar codes provide a coding gain of up to 0.5 dB as compared to LDPC and turbo codes, and have a higher error correction capability than classical polar codes with external CRC. Twisted polar codes allow reducing the error probability saturation level as compared to turbo codes and untwisted polar codes. FIG. 16 illustrates an example comparison of the error correction capability of twisted polar codes and generalized concatenated code with external Reed-Solomon codes and internal polar codes suggested in 12. It is seen that twisted polar codes provide a significantly better error correction capability.

Figure 14:
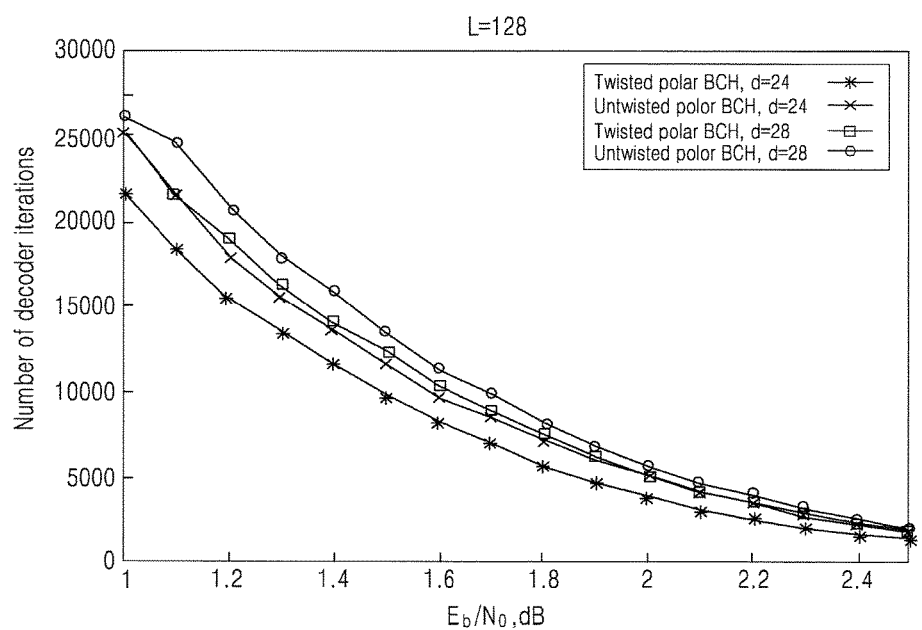
FIG. 14 illustrates an example number of decoder iterations for codes (1024, 512) according to this disclosure.
Figure 15:
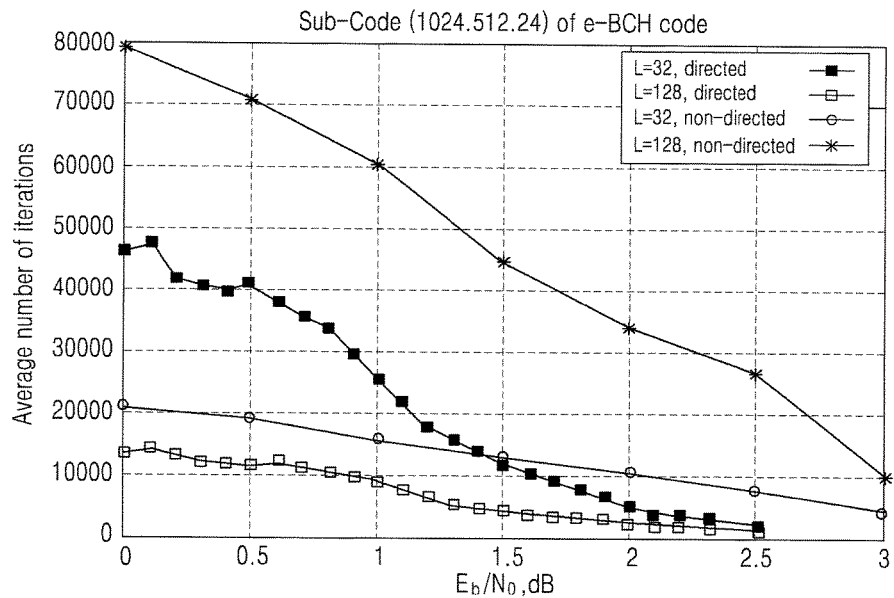
FIG. 15 illustrates an example number of iterations in a stack decoding algorithm according to this disclosure.
Figure 17:
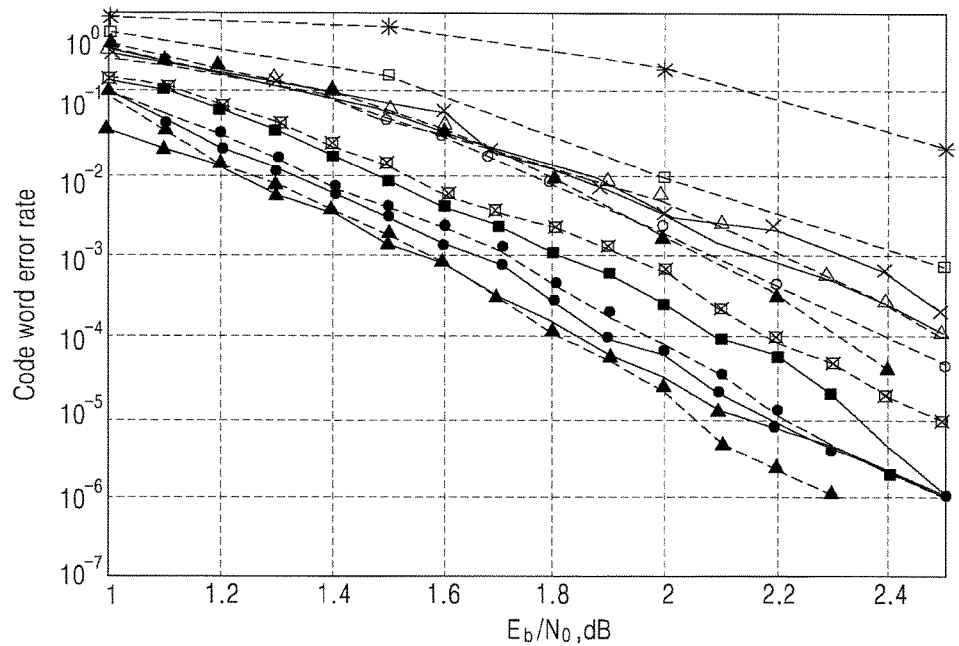
FIG. 17 illustrate an example comparison of error correction capability of twisted polar and LDPC codes according to this disclosure.

Furthermore, as shown in FIG. 14, twisted codes require less iterations in the improved stack decoding algorithm, such as they is subjected to decoding with less complexity. FIG. 15 illustrates an example comparison of the average number of iterations required for decoding (1024, 512) of untwisted polar code with dynamically frozen symbols using undirected stack algorithm 5 as illustrated in FIG. 4 and the present stack algorithm with directed search as illustrated in FIG. 9. It is seen that the use of directed search significantly reduces the number of iterations, especially in the high SNR domain. FIG. 17 illustrates an example of a more detailed comparison of the error correction capability of twisted polar and LDPC codes according to this disclosure. Error probabilities are presented for various values of parameter L (for polar codes) and maximum number of iterations in the confidence propagation algorithm. Both parameters determine the complexity of decoding. It is seen that the reduction in decoding complexity results in a less significant deterioration of the error correction capability with twisted polar codes as compared to LDPC. Moreover, increasing the decoding complexity ensures a greater error correction capability with twisted polar codes, whereas increasing the maximum number of iterations from 80 to 200 practically has no result with LDPC.

Figure 18:
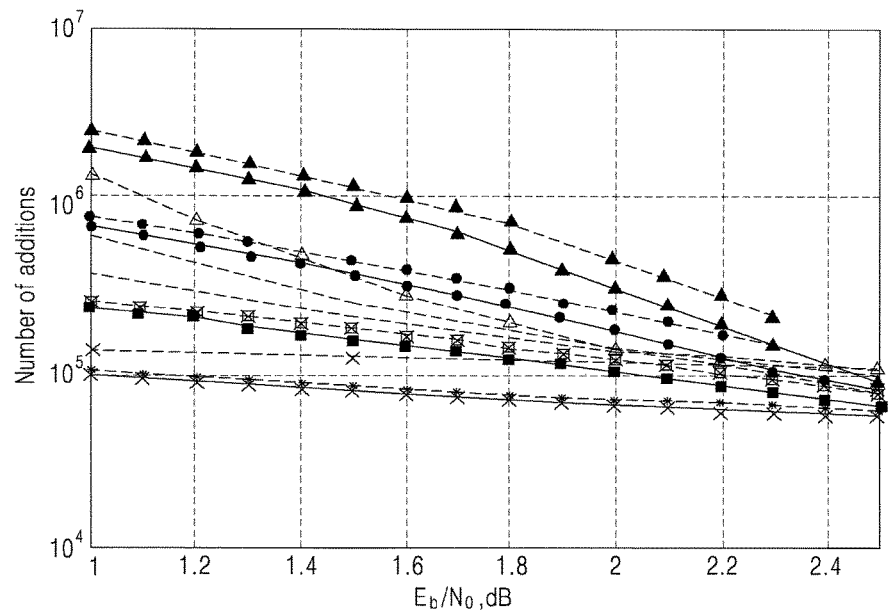
FIG. 18 illustrates an example comparison of the number of additions in decoding algorithms of twisted polar and LDPC codes according to this disclosure.
Figure 19:
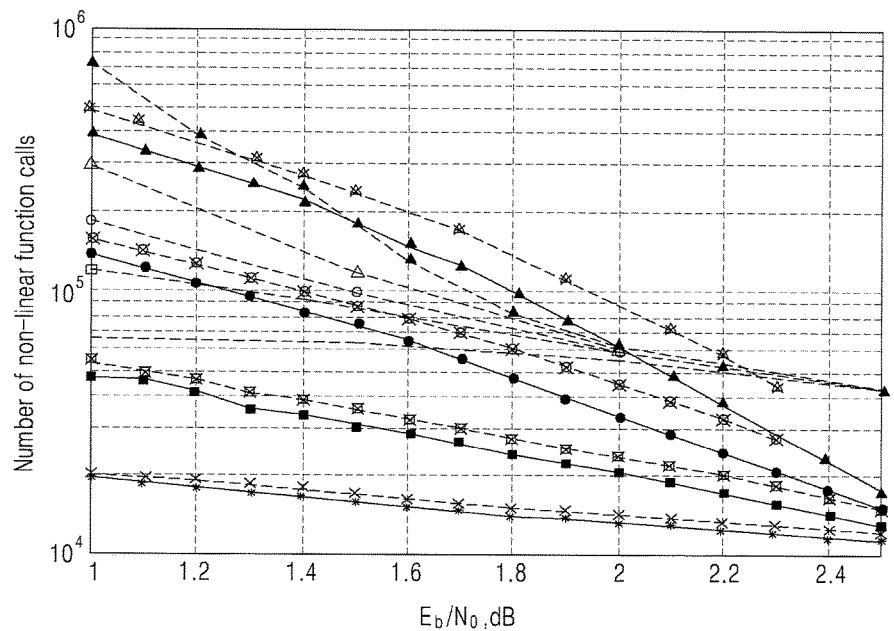
FIG. 19 illustrates an example comparison of the number of non-linear function calls in decoding algorithms of twisted polar and LDPC codes according to this disclosure.

FIGS. 18 and 19 represent the number of additions and computations of nonlinear function in max-log-MAP embodiment of the present decoding algorithm, and in the embodiment of confidence propagation algorithm in the logarithmic domain, used to decode LDPC codes. It is seen that twisted polar codes require fewer operations, especially in the high SNR domain. Max-Log-Map embodiment of the decoding algorithm involves computation of values $L_N^{(i)}(u_0^i|y_0^{N-1}) = \ln P_N^{(i)}(u_0^i|y_0^{N-1})$ instead of $P_N^{(i)}(u_0^i|y_0^{N-1})$. In this case, expressions (1) and (2) are reduced to $$L_N^{(2i)}(u_0^{2i}|y_0^{N-1}) = \\ 1 \begin{cases} L_{\frac{N}{2}}^{(i)}\left(u_{0,e}^{2i-1} + u_{0,o}^{2i-1}, u_{2i}\middle| y_0^{\frac{N}{2}-1}\right) + L_{\frac{N}{2}}^{(i)}\left(u_{0,o}^{2i-1}, u_{2i+1} = 0\middle| y_{\frac{N}{2}}^{N-1}\right), \\ L_{\frac{N}{2}}^{(i)}\left(u_{0,e}^{2i-1} + u_{0,o}^{2i-1}, u_{2i} + 1\middle| y_0^{\frac{N}{2}-1}\right) + L_{\frac{N}{2}}^{(i)}\left(u_{0,o}^{2i-1}, u_{2i+1} = 1\middle| y_{\frac{N}{2}}^{N-1}\right) \end{cases}$$

-continued $$L_N^{(2i+1)}(u_0^{2i+1} | y_0^{N-1}) = L_{\frac{N}{2}}^{(i)}\left(u_{0,e}^{2i+1} + u_{0,o}^{2i+1} \Big| y_0^{\frac{N}{2}-1}\right) + L_{\frac{N}{2}}^{(i)}\left(u_{0,o}^{2i+1} \Big| y_{\frac{N}{2}}^{N-1}\right),$$

where $j(A,B)=\max(A,B)+\ln(1+e^{-|A-B|})$.

Embodiments of the inventions are not limited to the embodiments described herein; those skilled in the art will appreciate based on the information described herein and the knowledge in the art that the invention is practiced by other than the described embodiments without departing from the spirit and scope of this disclosure.

The description does not specify hardware and software for implementing the invention, but those skilled in the art will appreciate that the essence of the invention is not limited to a particular hardware or software, and therefore the disclosure uses any hardware and software known in the art. Thus, hardware is implemented in one or more application specific integrated circuits, digital signal processors, digital signal processing devices, programmable logic devices, field programmable gate arrays, processors, controllers, microcontrollers, microprocessors, electronic devices, other electronic units capable to perform the described functions, computer, or a combination thereof.

Although not specifically mentioned, it is evident that storage of data, programs, etc., implies that there is a computer readable storage medium; examples of computer readable media include read-only memory, random access memory, register, cache memory, semiconductor memory devices, magnetic media such as internal hard disks and removable disks, magneto-optical media and optical media such as CD-ROM disks and digital versatile disks (DVD), as well as any conventional other storage media.

Although the present disclosure has been described with an exemplary embodiment, various changes and modifications is suggested to one skilled in the art. It is intended that the present disclosure encompass such changes and modifications as fall within the scope of the appended claims.

What is claimed is:

1. An encoding method in an encoder, the encoding method comprising:
   outputting, by a pre-coder, initial symbols including at least one information symbol, at least one frozen symbol, and at least one dynamically frozen symbol that corresponds to an input; and
   performing, by a polar coder, a permutation operation on at least two intermediate symbols by a given number of times and multiplexing, by a multiplexer, the at least two intermediate symbols to generate an output codeword,
   wherein an intermediate symbol is generated by performing a modulo-sum operation on at least two of the initial symbols or a pass-through operation on one of the initial symbols,
   wherein the intermediate symbol generated based on the pass-through operation is identical to the one of the initial symbols, and
   wherein the permutation operation is performed before forwarding the at least two intermediate symbols to a next layer twisted of polarization transformation.

2. The encoding method of claim 1, wherein the initial symbols are outputted based on a matrix with a preset dimension.

3. The method of claim 1, wherein a matrix with a preset dimension is determined by considering a channel status.

4. An encoder comprising:
   a pre-coder configured to output initial symbols including at least one information symbol, at least one frozen symbol, and at least one dynamically frozen symbol that correspond to an input; and
   a polar coder configured to perform a permutation operation on at least two intermediate symbols by a given number of times and a multiplexer configured to multiplex the at least two intermediate symbols to generate an output codeword,
   wherein an intermediate symbol is generated by performing a modulo-sum operation on at least two of the initial symbols or a pass-through operation on one of the initial symbols,
   wherein the intermediate symbol generated based on the pass-through operation is identical to the one of the initial symbols, and
   wherein the permutation operation is performed before forwarding the at least two intermediate symbols to a next layer twisted of polarization transformation.

5. The encoder of claim 4, wherein the initial symbols are outputted using a matrix with a preset dimension.

6. The encoder of claim 4, wherein a matrix with a preset dimension is determined by considering a channel status.

7. A method of an encoding apparatus, the method comprising:
   performing pre-coding, by a pre-coder, an input vector to generate an output vector;
   performing polar coding, by a polar coder, the output vector to generate a codeword; and
   performing a permutation operation on at least two intermediate symbols by a given number of times and multiplexing, by a multiplexer, the at least two intermediate symbols to generate the codeword,
   wherein a first part of elements included in the input vector is represented as a linear function of a second part of the elements included in the input vector based on an m-layer twisted polarization transformation provided by the pre-coding, wherein a permutation of the input vector including the elements is performed before forwarding the elements to a next layer twisted of polarization transformation,
   wherein an intermediate symbol is generated by performing a modulo-sum operation on at least two elements included in the output vector or a pass-through operation on one of the at least two elements included in the output vector, and
   wherein the intermediate symbol generated based on the pass-through operation is identical to the one of the at least two elements included in the output vector.

8. The method of claim 7, wherein the input vector includes data for a decoding apparatus.

9. The method of claim 8, wherein the data for the decoding apparatus is detected based on intermediate data of the decoding apparatus.

10. The method of claim 7, wherein the pre-coding is performed based on a minimum distance of the codeword.

11. An encoding apparatus, the encoding apparatus comprising:
   a pre-coder configured to pre-code an input vector to generate an output vector;
   a polar coder configured to polar code the output vector to generate a codeword; and
   a multiplexer configured to multiplex at least two intermediate symbols to generate the codeword,
   wherein a first part of elements included in the input vector is represented as a linear function of a second part of the elements included in the input vector based on an m-layer twisted polarization transformation provided by the pre-coding, and wherein a permutation of the input vector including the elements is performed before forwarding the elements to a next layer of polarization transformation, wherein the polar coder is configured to perform a permutation operation on at least two intermediate symbols by a given number of times and a multiplexer is configured to multiplex the at least two intermediate symbols to generate the codeword, wherein an intermediate symbol is generated by performing a modulo-sum operation on at least two elements included in the output vector or a pass-through operation on one of the at least two elements included in the output vector, and wherein the intermediate symbol generated based on the pass-through operation is identical to the one of the at least two elements included in the output vector.

12. The encoding apparatus of claim 11, wherein the input vector includes data for a decoding apparatus.

13. The encoding apparatus of claim 12, wherein the data for the decoding apparatus is detected based on intermediate data of the decoding apparatus.

14. The encoding apparatus of claim 11, wherein the pre-coding is performed based on a minimum distance of the codeword.

* * * * *